United States Patent
Zielinski

(10) Patent No.: US 9,178,480 B2
(45) Date of Patent: Nov. 3, 2015

(54) SYSTEMS AND METHODS FOR AUDIO DIFFERENCE DETECTION

(71) Applicant: Toyota Motor Engineering & Manufacturing North America, Inc., Erlanger, KY (US)

(72) Inventor: Eric John Zielinski, Plymouth, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 303 days.

(21) Appl. No.: 13/779,928

(22) Filed: Feb. 28, 2013

(65) Prior Publication Data

US 2014/0241531 A1    Aug. 28, 2014

(51) Int. Cl.
H04R 29/00 (2006.01)
H03G 3/20 (2006.01)
H04B 1/00 (2006.01)
H03G 3/00 (2006.01)
H03G 3/30 (2006.01)

(52) U.S. Cl.
CPC .................................. *H03G 3/3005* (2013.01)

(58) Field of Classification Search
CPC .......................................................... H03G 3/20
USPC ........................................ 381/57, 56, 86, 104
See application file for complete search history.

(56) References Cited

U.S. PATENT DOCUMENTS

| | | | |
|---|---|---|---|
| 4,340,780 A | | 7/1982 | Odlen |
| 6,061,455 A | * | 5/2000 | Hadley et al. ................ 381/57 |
| 6,154,666 A | | 11/2000 | Patterson et al. |
| 7,684,480 B2 | | 3/2010 | Kelly et al. |
| 8,194,869 B2 | | 6/2012 | Mihelich et al. |
| 8,284,960 B2 | | 10/2012 | Vaudrey et al. |
| 2005/0271219 A1 | * | 12/2005 | Bruelle-Drews ............... 381/86 |
| 2012/0321104 A1 | | 12/2012 | Kemmerer et al. |

* cited by examiner

*Primary Examiner* — Thjuan K Addy
(74) *Attorney, Agent, or Firm* — Dinsmore & Shohl LLP

(57) ABSTRACT

Systems and methods for audio difference detection include a memory component that stores logic that, when executed by a processor, causes a vehicle amplifier to receive a test input signal for a generic test sequence to determine a standard input signal for producing a desired output response signal, store the standard input signal with standard amplifier settings associated with the standard input signal, and receive an audio signal from a head unit of the vehicle, where the head unit is part of the vehicle audio system for the vehicle in which the vehicle amplifier is utilized. In some embodiments, the logic causes the vehicle amplifier to determine whether there is a difference between the audio signal and the standard input signal and in response to determining there is a difference, and adjust vehicle amplifier settings of the vehicle amplifier, such that vehicle speakers output the desired output response signal.

20 Claims, 3 Drawing Sheets

SYSTEMS AND METHODS FOR AUDIO DIFFERENCE DETECTION

TECHNICAL FIELD

Embodiments described herein generally relate to detecting an audio difference and, more specifically, to providing a consistent audio experience across vehicles through adjusting a vehicle amplifier.

BACKGROUND

It is generally desired to create a vehicle audio environment that is consistent across mass produced vehicles. Accordingly, current vehicle amplifiers may receive an audio signal from a head unit and adjust the output to the speakers based on the head unit type. Specifically, a head unit type may be determined and sent to the amplifier. Based on that head unit type, the amplifier may be configured to make a single, static adjustment for all signals received from the head unit. This is often referred to as emphasis and de-emphasis technology. While such a configuration may be utilized, this single adjustment is often inaccurate for many signals received by the amplifier to provide the desired audio output in a specific vehicle.

SUMMARY

Systems and methods for audio difference detection are described. One embodiment of a method includes receiving a standard input signal for an amplifier, where the amplifier comprises an audio input line, and the standard input signal was determined via a generic test sequence, sensing an audio signal at the amplifier from a head unit on the audio input line, and determining whether there is a difference between the audio signal and the standard input signal. Some embodiments include recognizing an amount of the difference between the audio signal and the standard input signal and adjusting amplifier settings of the amplifier, such that vehicle speakers output a desired output response according to the standard input signal.

In another embodiment, a system includes an amplifier comprising an audio input line and an audio output line, the audio input line for receiving input signals from a head unit, the audio output line for outputting audio signals to a speaker and a vehicle computing device that stores logic for implementing a test sequence and adjusting amplifier settings of the amplifier. The logic may cause the vehicle computing device to receive a standard input signal for the amplifier, the standard input signal being associated with the input signals from a generic head unit to produce a desired output response, receive data related an audio input signal from the amplifier, the audio input signal being received from the head unit on the input line, and determine whether there is a difference between the audio input signal and the standard input signal. In some embodiments, the logic causes the vehicle computing device to, in response to determining that there is the difference, adjusting amplifier settings of the amplifier to realize the desired output response.

In yet another embodiment, a vehicle amplifier includes a memory component that stores logic that, when executed by a processor, causes a vehicle amplifier to receive a test input signal for a generic test sequence to determine a standard input signal for producing a desired output response signal, store the standard input signal with standard amplifier settings associated with the standard input signal, and receive an audio signal from a head unit of the vehicle, where the head unit is part of the vehicle audio system for the vehicle in which the vehicle amplifier is utilized. In some embodiments, the logic causes the vehicle amplifier to determine whether there is a difference between the audio signal and the standard input signal and in response to determining there is a difference, and adjust vehicle amplifier settings of the vehicle amplifier, such that vehicle speakers output the desired output response signal.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for audio detection. Some embodiments are configured with an amplifier that automatically adjusts for audio signal tolerance variation. This would replace the emphasis and de-emphasis technology by eliminating the tolerance on the audio input signal from the head unit, since embodiments disclosed herein automatically adjust the amplified output signal by an amount approximately equal to the difference that the audio signal has (or audio signals have) deviated.

Specifically, during development, the amplifier may be tuned for the vehicle interior. At that time, a reading may be taken of the audio signal input for each audio line into the amplifier. Depending on the particular embodiment, a generic test sequence with one or more test input signals may be utilized to determine a desired output response. The desired output response may or may not be the exact sounds output by a speaker. In some embodiments the desired output response may represent a frequency response or frequency response data of the amplifier for providing the desired sounds. Regardless, once the amplifier is adjusted to provide the desired output response, the amplifier settings may be stored and the test input signals may be stored as the standard input signal in the amplifier.

Once in production, when head units with different tolerance variations are installed into the vehicles, the amplifier is configured to sense the audio input line. In some embodiments, a vehicle-specific test sequence may be executed to provide these input signals. When a difference occurs between the received input signal and the standard input signal, the amplifier recognizes this difference and automatically adjusts the gain on the output to the speakers to compensate for this difference. The amplifier may correct the gain by utilizing speakers and/or microphones within the vehicle to determine when the desired output response is received. If no difference is detected between the received input signal and the standard input signal (or the difference is within a predetermined acceptable range), the current amplifier settings may be utilized as the standard amplifier settings. This will insure that the overall vehicle frequency response is consistent among vehicles in mass production.

Figure 1:
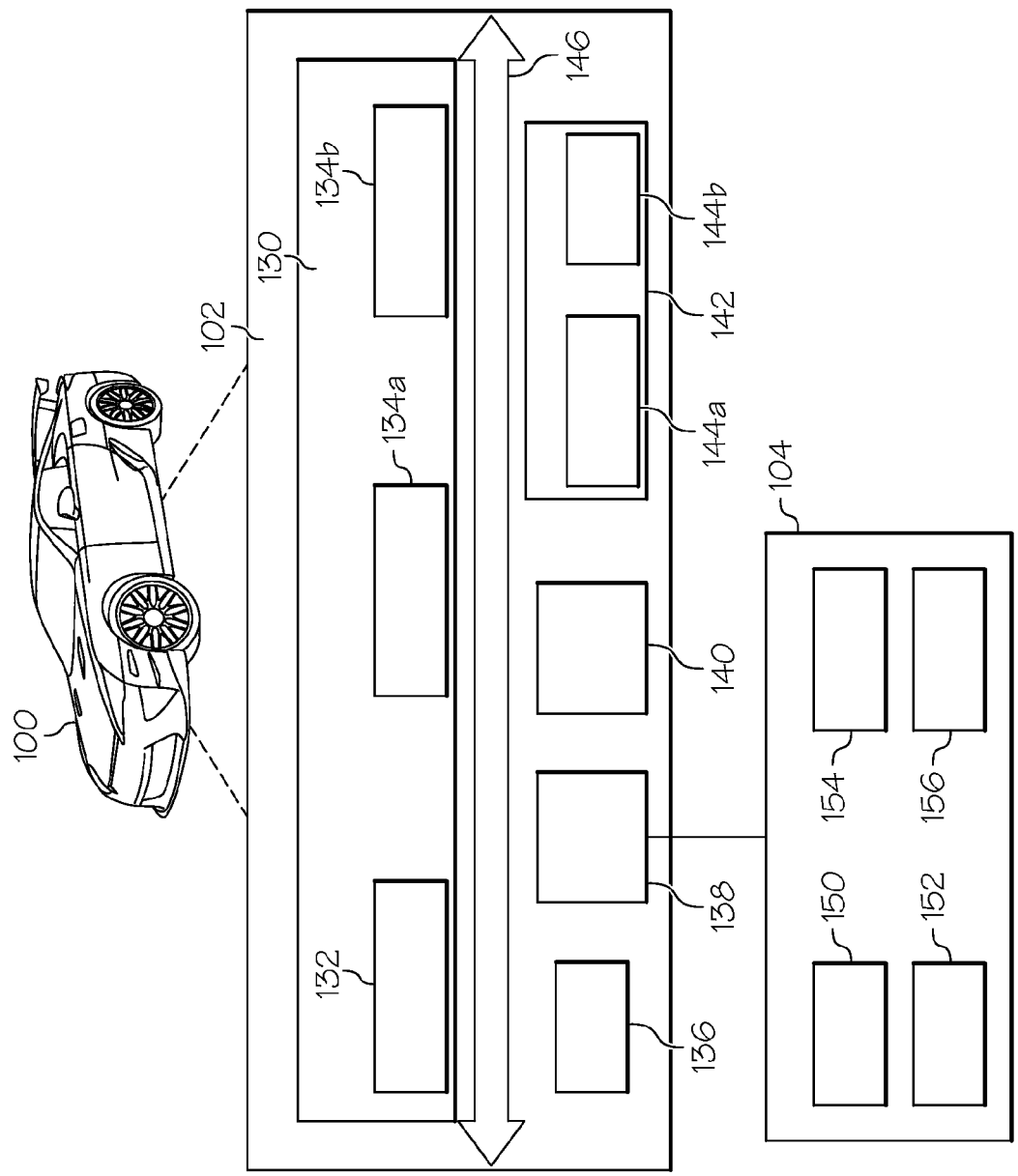
FIG. 1 schematically depicts a vehicle, including a vehicle computing device and a vehicle audio system, according to embodiments disclosed herein.

Referring now to the drawings, FIG. 1 schematically depicts a vehicle 100, including a vehicle computing device 102 and a vehicle audio system 104, according to embodiments disclosed herein. The vehicle 100 is depicted in FIG. 1 as an automobile, but may be any passenger or non-passenger vehicle such as, for example, a terrestrial, aquatic, and/or airborne vehicle.

Illustrated in the vehicle computing device 102 are a memory component 130, a processor 136, input/output hardware 138, network interface hardware 140, and a data storage component 142 (which stores frequency response data 144a, position data 144b, and/or other data), and the memory component 130. The memory component 130 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the vehicle computing device 102 and/or external to the vehicle computing device 102.

The memory component 130 may store operating logic 132, test logic 134a and the adjustment logic 134b. The test logic 134a and the adjustment logic 134b may each include a plurality of different pieces of logic, each of which may be embodied as a computer program, firmware, and/or hardware, as an example. A communications path 146 is also included in FIG. 1 and may be implemented as a bus or other communication interface to facilitate communication among the components of the vehicle computing device 102.

The processor 136 may include any processing component operable to receive and execute instructions (such as from a data storage component 142 and/or the memory component 130). As described above, the input/output hardware 138 may include and/or be configured to interface with external components, such as the vehicle audio system 104. The vehicle audio system 104 may include an amplifier 150, microphones 152, speakers 154, and/or head unit 156. As described in more detail below, amplifier 150 may include an audio amplifier that receives input signals and provides frequency response data to send output to the speakers 154, an equalizer, and/or other audio component. Depending on the particular embodiment, the amplifier 150 may include any of the components depicted in the vehicle computing device 102 for implementing the desired functionality, such as a memory component, processor, etc. Additionally, the amplifier 150 may include an input line (one or more) and an output line (one or more) for receiving input signals, and providing output signals, respectively.

The speakers 154 may include any type of audio output device for producing sound for the vehicle audio system 104. The microphones 152 may include any device for receiving audio data. As is understood, the microphones 152 and the speakers 154 may be physically similar devices that are utilized for different purposes. The head unit 156 may include a compact disc player, a digital video disc player, an equalizer, a media file player, a user interface, a navigation system, and/or other components for facilitating production of audio in the vehicle 100.

The network interface hardware 140 may include and/or be configured for communicating with any wired or wireless networking hardware, including an antenna, a modem, a LAN port, wireless fidelity (Wi-Fi) card, WiMax card, mobile communications hardware, and/or other hardware for communicating with other networks and/or devices. From this connection, communication may be facilitated between the vehicle computing device 102 and other computing devices. Accordingly, while the vehicle audio system 104 is depicted in FIG. 1 as being coupled to the vehicle computing device 102 via the input/output hardware 138, this is merely an example. Specifically, some embodiments may be configured such that one or more components of the vehicle audio system 104 may operate via a wired or wireless connection with the network interface hardware 140.

The operating logic 132 may include an operating system and/or other software for managing components of the vehicle computing device 102. As discussed above, the test logic 134a may reside in the memory component 130 and may be configured to cause the processor 136 to perform one or more audio tests on outputs from the vehicle audio system 104. Similarly, the adjustment logic 134b may be utilized to alter the audio output of the amplifier 150 to the speakers 154, based on the results determined via the test logic 134a.

It should be understood that while the components in FIG. 1 are illustrated as residing within and/or connected to the vehicle computing device 102 and vehicle audio system 104, this is merely an example. In some embodiments, one or more of the components may reside external to the vehicle computing device 102 and/or vehicle audio system 104. It should also be understood that, while the vehicle computing device 102 and the vehicle audio system 104 are each illustrated as a single device, this is also merely an example. In some embodiments, the components depicted therein may reside on different computing devices.

Additionally, while the vehicle computing device 102 is illustrated with the test logic 134a and the adjustment logic 134b as separate logical components, this is also an example. In some embodiments, a single piece of logic may cause the vehicle computing device 102 to provide the described functionality.

As an example, embodiments discussed herein may be configured to tune an amplifier 150 for a generic vehicle. The amplifier 150 may store (via an internal memory component and/or via the memory component 130) the input signals, as well as the frequency response data associated with the input signals. When the amplifier 150 is installed in to the vehicle 100, the head unit 156 may provide different input line signals than the generic vehicle. Accordingly, embodiments disclosed herein may be configured to run a test sequence and cause the amplifier 150 to detect signals from the input line and compare the signals to the desired frequency response data. If the stored signals substantially match the received input signals, the amplifier 150 may be implemented as configured. If not, the amplifier 150 may determine the difference between the stored input signals and the received input signals. If the difference is within a predetermined acceptable range, the amplifier 150 may be implemented as configured. If not, the vehicle amplifier settings (such as gain, crossover, filters, mode, phase, equalizer, etc.) may be altered to compensate for the difference in inputs received.

Figure 2:
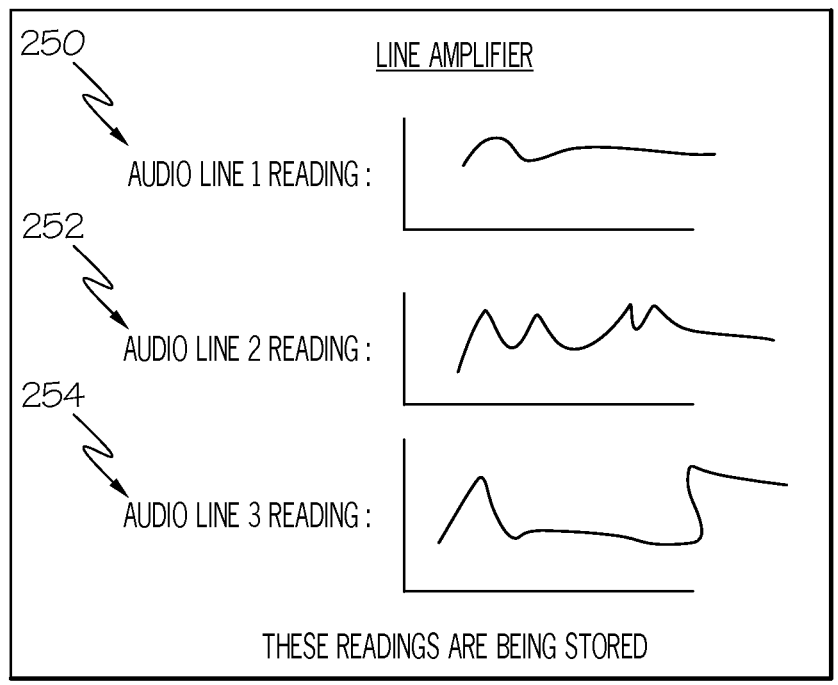
FIG. 2 schematically depicts a graphical representation of frequency response output of an amplifier, according to embodiments disclosed herein.

FIG. 2 schematically depicts a graphical representation of frequency response output of an amplifier, according to embodiments disclosed herein. During production, the amplifier 150 may be configured according to a generic vehicle, with desired frequency response data. Specifically, the amplifier 150 may receive test input signals on audio lines of the amplifier 150, which are depicted as curves 250, 252, and 254. The processing of these input lines may be altered, such that the amplifier 150 provides the desired output response data. Once the amplifier settings have been set, the settings may be stored.

Figure 3:
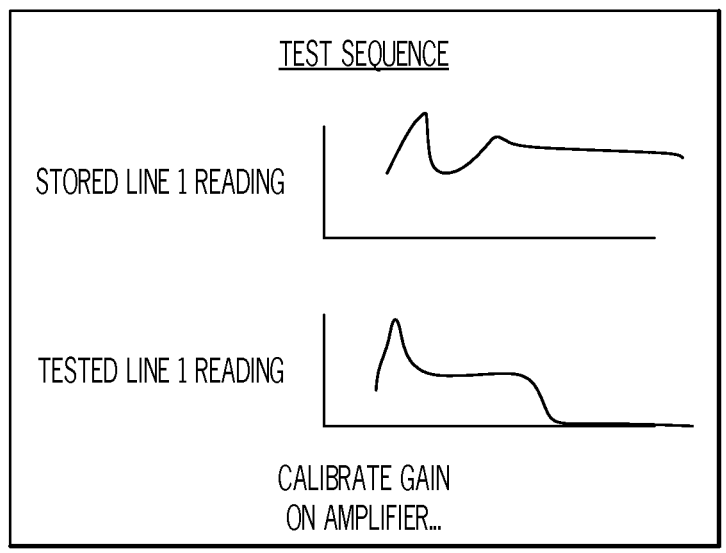
FIG. 3 schematically depicts graphical results of a test sequence of an amplifier, according to embodiments disclosed herein.

FIG. 3 schematically depicts graphical results of a test sequence of an amplifier 150, according to embodiments disclosed herein. As illustrated, once the amplifier 150 is installed into the vehicle 100, a test sequence may be executed to determine the operation of the head unit 156 with the amplifier 150. Accordingly, the input lines to the amplifier 150 may again be read and the readings may be compared to the stored lines readings associated with the desired frequency response data. If the stored line readings substantially match the tested line readings, the amplifier 150 may be implemented as configured. If not, the amplifier gain may be adjusted to provide the desired frequency response as provided with the stored line readings.

Figure 4:
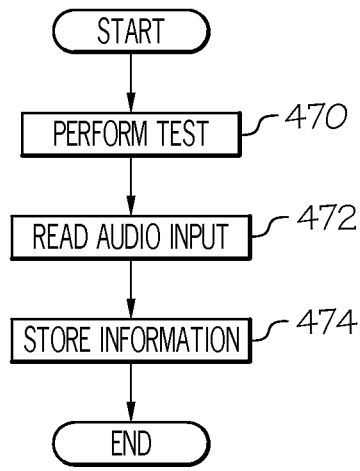
FIG. 4 depicts a flowchart for reading an audio input, according to embodiments disclosed herein.

FIG. 4 depicts a flowchart for reading an audio input, according to embodiments disclosed herein. As illustrated in block 470, an audio test may be performed on the amplifier 50. In block 472, the audio input to the amplifier 150 may be read to determine input to a plurality of input lines into the amplifier 150 for achieving the desired frequency response data. In block 474, the information may be stored for implementation in other vehicles.

Figure 5:
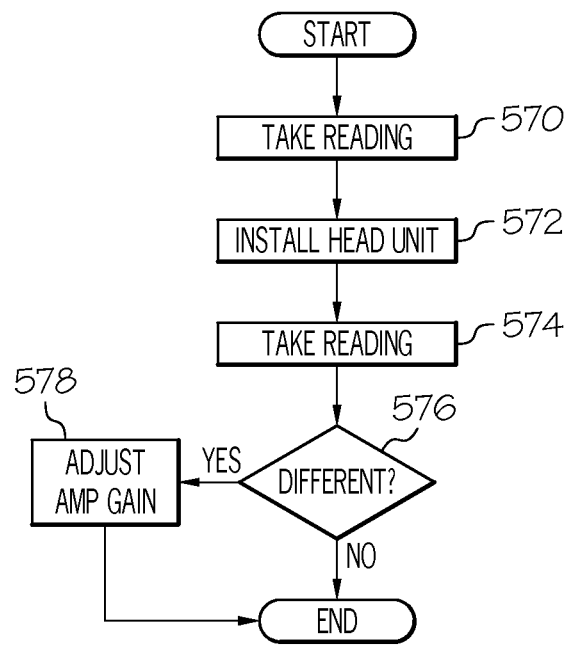
FIG. 5 depicts a flowchart for adjusting amplifier gain of an amplifier, according to embodiments disclosed herein.

FIG. 5 depicts a flowchart for adjusting amplifier gain of an amplifier 150, according to embodiments disclosed herein. As illustrated in block 570, a reading of input lines from a generic head unit to the amplifier 150 may be taken. In block 572, the head unit 156 and amplifier 150 may be installed into the vehicle 100. In block 574 a reading regarding input lines of a test sequence from the head unit 156 to the amplifier 150 may be taken. In block 576 a comparison may be made regarding whether the input signals from the generic head unit substantially match the input signals from the head unit 156. In response to determining that the input signals substantially match, the process may end and the amplifier 150 may operate as configured. In response to determining that the input signals from the generic head unit differ from the input signals from the head unit 156, the gain or other amplifier settings of the amplifier 150 may be adjusted, and the process may end.

As illustrated above, various embodiments for audio difference detection are disclosed. Specifically, embodiments herein may provide a consistent audio experience across a fleet of vehicles with the same amplifier. Accordingly, manual settings by the driver and/or passenger need not be made.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems, methods, and non-transitory computer-readable mediums for providing the described functionality. It should also be understood that these embodiments are merely exemplary and are not intended to limit the scope of this disclosure.

What is claimed is:

1. A method for audio difference detection for a vehicle audio system of a vehicle comprising:
    receiving a standard input signal for an amplifier, wherein the amplifier comprises an audio input line, and wherein the standard input signal was determined via a generic test sequence;
    sensing an audio signal at the amplifier from a head unit on the audio input line;
    determining a difference between the audio signal and the standard input signal;
    recognizing an amount of the difference between the audio signal and the standard input signal; and
    adjusting amplifier settings of the amplifier, such that vehicle speakers output a desired output response according to the standard input signal.

2. The method of claim 1, wherein determining the amount of the difference comprises determining whether the difference is within a predetermined acceptable range.

3. The method of claim 1, wherein adjusting the amplifier settings comprises adjusting a gain on the amplifier.

4. The method of claim 1, wherein the audio signal is sensed on a plurality of input lines on the amplifier.

5. The method of claim 1, wherein the generic test sequence comprises:
    receiving a test input signal into the amplifier; and
    storing information related to the test input signal as the standard input signal in the amplifier.

6. The method of claim 1, wherein the generic test sequence comprises a test input signal received by the amplifier and the amplifier settings are adjusted to provide the desired output response according to the standard input signal.

7. The method of claim 1, wherein the audio signal is part of a vehicle-specific test sequence for adjusting the amplifier settings to match the desired output response.

8. A system for audio difference detection for a vehicle audio system of a vehicle comprising:
    an amplifier comprising an audio input line and an audio output line, the audio input line for receiving input signals from a head unit, the audio output line for outputting audio signals to a speaker; and
    a vehicle computing device that stores logic for implementing a test sequence and adjusting amplifier settings of the amplifier, wherein the logic causes the vehicle computing device to perform at least the following:
        receive a standard input signal for the amplifier, the standard input signal being associated with the input signals from a generic head unit to produce a desired output response;
        receive data related to an audio input signal from the amplifier, the audio input signal being received from the head unit on the audio input line;
        determine whether there is a difference between the audio input signal and the standard input signal; and
        in response to determining that there is the difference, adjusting amplifier settings of the amplifier to realize the desired output response.

9. The system of claim 8, wherein the amplifier settings are adjusted by an amount approximately equal to the difference.

10. The system of claim 8, wherein the logic further causes the vehicle computing device to perform at least the following:
    determine whether the difference is within a predetermined acceptable range;

in response to determining that the difference is within the predetermined acceptable range, utilize the amplifier settings associated with the standard input signal for the amplifier; and in response to determining that the difference is not within the predetermined acceptable range, adjust the amplifier settings on the amplifier to realize the desired output response.

11. The system of claim 8, wherein adjusting the amplifier settings comprises adjusting a gain on the amplifier.

12. The system of claim 8, wherein the standard input signal is derived by performing a generic test sequence prior to the amplifier being installed in the vehicle.

13. The system of claim 12, wherein the generic test sequence comprises receiving a test input signal into the amplifier and storing information related to the test input signal as the standard input signal in the amplifier.

14. The system of claim 8, wherein the audio input signal is part of a vehicle-specific test sequence for adjusting the amplifier settings to realize the desired output response for the vehicle.

15. A vehicle amplifier for audio difference detection for a vehicle audio system of a vehicle comprising:
   a memory component that stores logic that, when executed by a processor, causes the vehicle amplifier to perform at least the following:
      receive a test input signal for a generic test sequence to determine a standard input signal for producing a desired output response;
      store the standard input signal with standard amplifier settings associated with the standard input signal;
      receive an audio signal from a head unit of the vehicle, wherein the head unit is part of the vehicle audio system for the vehicle in which the vehicle amplifier is utilized;
      determine whether there is a difference between the audio signal and the standard input signal; and
      in response to determining there is a difference, adjust vehicle amplifier settings of the vehicle amplifier, such that vehicle speakers output the desired output response.

16. The vehicle amplifier of claim 15, wherein adjusting the amplifier settings comprises adjusting a gain on the amplifier.

17. The vehicle amplifier of claim 15, wherein the logic further causes the vehicle amplifier to perform at least the following:
   determine whether the difference is within a predetermined acceptable range;
   in response to determining that the difference is within the predetermined acceptable range, utilize the vehicle amplifier settings associated with the standard input signal for the vehicle amplifier; and
   in response to determining that the difference is not within the predetermined acceptable range, adjust the vehicle amplifier settings on the vehicle amplifier to realize the desired output response.

18. The vehicle amplifier of claim 15, wherein adjusting the vehicle amplifier settings comprises adjusting a gain on the vehicle amplifier.

19. The vehicle amplifier of claim 15, wherein the audio signal is part of a vehicle-specific test sequence for adjusting the vehicle amplifier settings to realize the desired output response.

20. The vehicle amplifier of claim 15, wherein the generic test sequence is received prior to the vehicle amplifier being installed into the vehicle.

* * * * *